United States Patent
Su et al.

(10) Patent No.: US 11,018,266 B2
(45) Date of Patent: May 25, 2021

(54) REDUCED SURFACE FIELD LAYER IN VARACTOR

(71) Applicant: Taiwan Semiconductor Manufacturing Co., Ltd., Hsin-Chu (TW)

(72) Inventors: Liang-Yu Su, Yunlin County (TW); Chih-Wen Yao, Hsinchu (TW); Hsiao-Chin Tuan, Ju Dong County (TW); Ming-Ta Lei, Hsin-Chu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/434,381

(22) Filed: Jun. 7, 2019

(65) Prior Publication Data
US 2020/0127146 A1   Apr. 23, 2020

Related U.S. Application Data

(60) Provisional application No. 62/749,188, filed on Oct. 23, 2018.

(51) Int. Cl.
*H01L 29/93* (2006.01)
*H01L 27/08* (2006.01)
*H01L 29/66* (2006.01)
*H01L 29/06* (2006.01)

(52) U.S. Cl.
CPC .......... *H01L 29/93* (2013.01); *H01L 27/0808* (2013.01); *H01L 29/063* (2013.01); *H01L 29/66174* (2013.01)

(58) Field of Classification Search
CPC . H01L 29/93; H01L 29/063; H01L 29/66174; H01L 27/0808
See application file for complete search history.

(56) References Cited

U.S. PATENT DOCUMENTS

| | | | |
|---|---|---|---|
| 2014/0054694 A1* | 2/2014 | Min | H01L 29/66659 257/336 |
| 2014/0070315 A1* | 3/2014 | Levy | H01L 27/0617 257/343 |
| 2016/0079344 A1* | 3/2016 | Agam | H01L 29/0619 257/493 |

(Continued)

*Primary Examiner* — Phuc T Dang
(74) *Attorney, Agent, or Firm* — Eschweiler & Potashnik, LLC

(57) ABSTRACT

Various embodiments of the present disclosure are directed towards a varactor comprising a reduced surface field (RESURF) region. In some embodiments, the varactor includes a drift region, a gate structure, a pair of contact regions, and a RESURF region. The drift region is within a substrate and has a first doping type. The gate structure overlies the drift region. The contact regions are within the substrate and overlie the drift region. Further, the contact regions have the first doping type. The gate structure is laterally sandwiched between the contact regions. The RESURF region is in the substrate, below the drift region, and has a second doping type. The second doping type is opposite the first doping type. The RESURF region aids in depleting the drift region under the gate structure, which decreases the minimum capacitance of the varactor and increases the tuning range of the varactor.

20 Claims, 12 Drawing Sheets

(56) References Cited

U.S. PATENT DOCUMENTS

| | | |
|---|---|---|
| 2017/0069766 A1 | 3/2017 | Park et al. |
| 2017/0263759 A1* | 9/2017 | Chung ................ H01L 29/0634 |
| 2019/0006460 A1* | 1/2019 | Chiu ................... H01L 29/1095 |

* cited by examiner

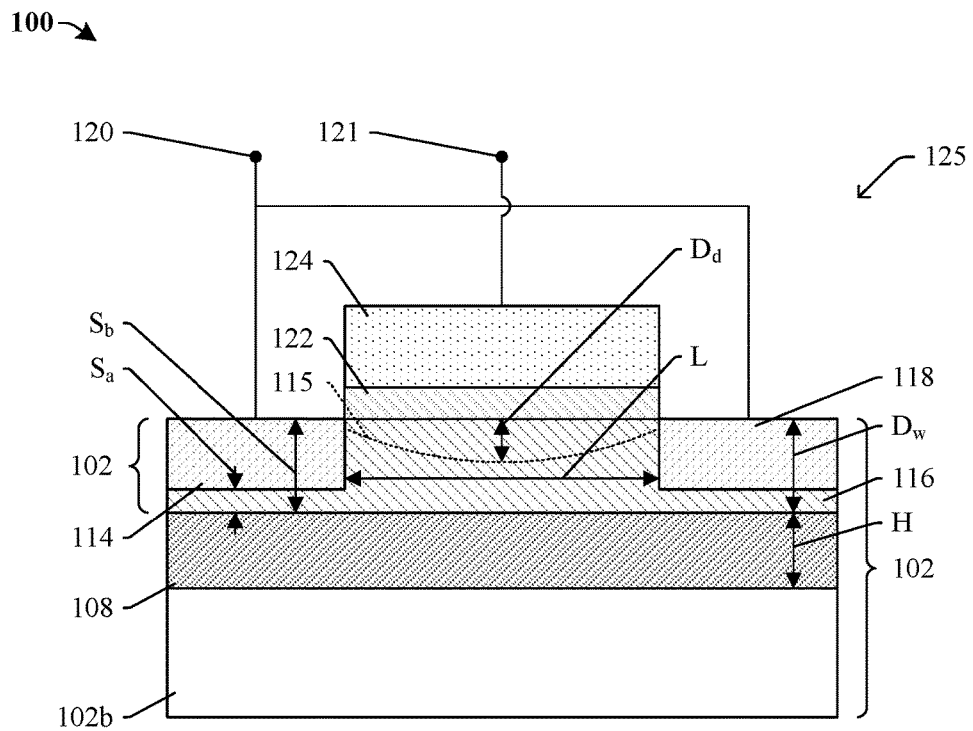
Fig. 1
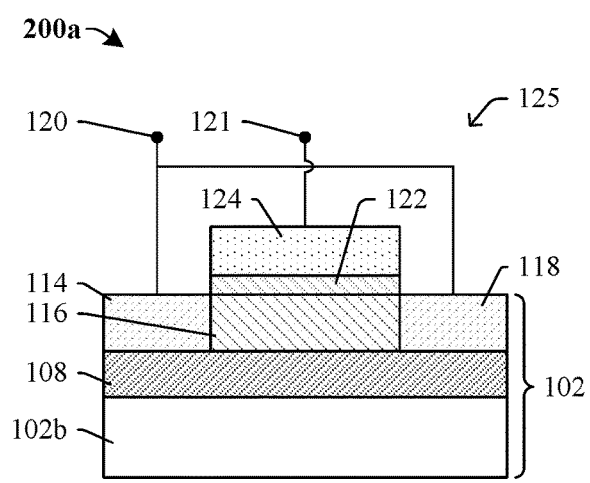 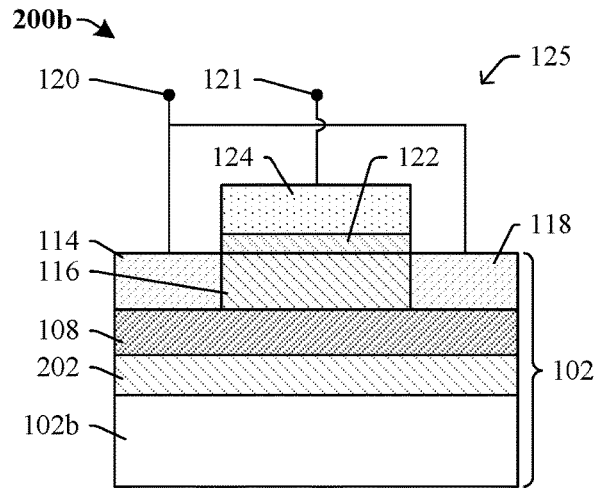
Fig. 2A  Fig. 2B

REDUCED SURFACE FIELD LAYER IN VARACTOR

REFERENCE TO RELATED APPLICATION

This application claims the benefit of U.S. Provisional Application No. 62/749,188, filed on Oct. 23, 2018, the contents of which are hereby incorporated by reference in their entirety.

BACKGROUND

Many modern-day electronic devices contain metal-oxide-semiconductor (MOS) varactors. A MOS varactor is a semiconductor diode with a capacitance dependent upon the voltage across the MOS varactor. MOS varactors have been used commonly as tuning components in LC-tank voltage controlled oscillators (VCOs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional view of some embodiments of an integrated circuit (IC) including a MOS varactor with a RESURF region.

FIGS. 2A-2E illustrate cross-sectional views of various alternative embodiments of the IC of FIG. 1.

DETAILED DESCRIPTION

Figure 2C:
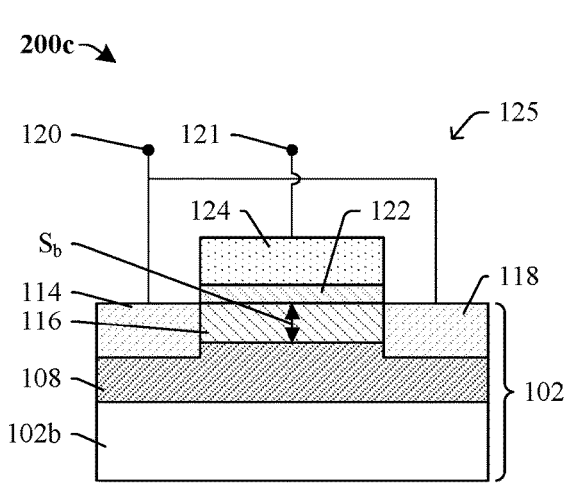

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A typical metal oxide semiconductor (MOS) varactor includes a gate structure over an N-type well region, which is within a substrate. N+-type contact regions are in the substrate, overlying the N-type well, and are respectively along opposite sidewalls of the gate structure. The gate structure comprises a gate electrode disposed over a gate-oxide layer. Applying a voltage from the gate electrode to the N+-type contact regions varies a capacitance of the MOS varactor. Increasing the voltage increases the concentration of electrons in the N-type well, along the gate electrode, thereby reducing resistance between the N+-type contact regions and increasing the capacitance of the MOS varactor. Continuing to increase the voltage increases the capacitance until a maximum capacitance.

Decreasing the voltage decreases the concentration of electrons in the N-type well, along the gate electrode, thereby increasing resistance between the N+-type contact regions and decreasing the capacitance of the MOS varactor. At a certain voltage, while decreasing the voltage across the MOS varactor, a depletion region forms in the N-type well. Further, continuing to decrease the voltage increases the depth to which the depletion region extends into the N-type well until a maximum depletion depth is reached. At the maximum depletion depth, the MOS varactor reaches its minimum capacitance. The ratio of the maximum capacitance to the minimum capacitance defines a tuning range of the MOS varactor. The larger the tuning range, the better since a large tuning range provides greater flexibility for circuit designers.

Increasing the doping concentration of the N-type well reduces the resistance of the N-type well and improves the Q factor of the MOS varactor. However, the increased doping concentration decreases the maximum depletion depth. This, in turn, increasing the minimum capacitance of the MOS varactor and decreases the tuning range of the MOS varactor. Therefore, there is a tradeoff between Q factor and tuning range.

Various embodiments of the present disclosure are directed towards a varactor comprising a reduced surface field (RESURF) region. In some embodiments, the varactor is on a substrate and comprises a drift region, a gate structure, a pair of contact regions, and a RESURF region. The drift region is within the substrate and has a first doping type. The gate structure overlies the drift region. The contact regions are within the substrate and overlie the drift region. Further, the contact regions have the first doping type. The gate structure is laterally sandwiched between the contact regions. The RESURF region is in the substrate, below the drift region, and has a second doping type. The second doping type is opposite the first doping type.

The RESURF region aids in depleting the drift region under the gate structure. When the varactor is in depletion mode, depletion is greater with the RESURF region than without the RESURF region for a given voltage. Further, full depletion may be achieved with the RESURF region. Since the capacitance of the varactor decreases as depletion increases, inclusion of the RESURF region decreases the minimum capacitance. This, in turn, increases the tuning range of the varactor. Since depletion is enhanced, the Q factor of the varactor may be increased while still maintaining a good tuning range. For example, the doping concentration of the drift region may be increased, or the gate length of the gate structure may be decreased, to decrease resistance between the contact regions and enhance the Q factor.

With reference to FIG. 1, a cross-sectional view 100 of some embodiments of an integrated circuit (IC) comprising a varactor 125 is provided. The varactor 125 is disposed on a substrate 102. The substrate 102 may be, for example, a bulk substrate (e.g., a bulk silicon substrate), a silicon-on-insulator (SOI) substrate, or some other suitable substrate. In some embodiments, the substrate 102 comprises one or more epitaxial layers. The varactor 125 includes a RESURF region 108, and further includes a well region 116 (in some embodiments, it is called a drift region). The RESURF region 108 and the well region 116 are disposed within the substrate 102 and overlie a bulk region 102b of the substrate 102. Further, the well region 116 overlies the RESURF region 108. The RESURF region 108 and the well region 116 have opposite doping types and, during use of the varactor 125, the RESURF region 108 aides in forming a depletion region 115 in the substrate 102.

A first contact region 114 and a second contact region 118 are disposed within the substrate 102, overlying the well region 116. Further, the first and second contact regions 114, 118 are respectively along opposite sidewalls of a gate structure. The first and second contact regions 114, 118 have the same doping type, but a greater doping concentration than the well region 116, and are electrically coupled together at a first terminal 120 of the varactor 125. The gate structure overlies the well region 116, laterally between the first and second contact regions 114, 118. The gate structure comprises a gate dielectric layer 122, and further comprises a gate electrode 124 overlying the gate dielectric layer 122. A second terminal 121 of the varactor 125 is electrically coupled to the gate electrode 124.

In some embodiments, during operation of the varactor 125, the varactor 125 varies between states depending upon the voltage applied from the second terminal 121 of the varactor 125 to the first terminal 120 of the varactor 125. The varactor 125 may, for example, be in a state of accumulation where majority carries accumulate in the well region 116, along the gate structure. The varactor 125 may, for example, be in a state of depletion where majority carriers are partially or fully depleted from the well region 116, along the gate structure. Where the well region 116 is N-type, the majority carrier is electrons. Where the well region 116 is P-type, the majority carrier is holes. Further, the capacitance of the varactor 125 varies between a minimum capacitance and a maximum capacitance depending upon the voltage applied from the second terminal 121 of the varactor 125 to the first terminal 120 of the varactor 125. Where the well region 116 is N-type, increasing the voltage increases capacitance and decreasing the voltage decreases capacitance. Where the well region 116 is P-type, increasing the voltage decreases capacitance and decreasing the voltage increases capacitance.

When the varactor 125 is in a state of depletion, the depletion region 115 forms in the substrate 102, overlying the well region 116. Further, while the varactor 125 is in a state of depletion, moving the voltage across the varactor 125 towards the voltage at the minimum capacitance increases the depth $D_d$ to which the depletion region 115 extends into the substrate 102 until a maximum depletion depth is reached. Hence, as the depletion depth $D_d$ of the depletion region 115 increases, the capacitance of the varactor 125 decreases. Further, at the maximum depletion depth, the varactor 125 has its minimum capacitance.

By including the RESURF region 108, the substrate 102 is more readily depleted under the gate structure, whereby the maximum depletion depth is increased. In some embodiments, full depletion can be achieved under the gate structure, such that the depletion region 115 extends from a top surface of the substrate 102 to the RESURF region 108. Due to the increase in the maximum depletion depth, the minimum capacitance of the varactor 125 is reduced and the tuning range of the varactor 125 is increased. As noted above, the tuning range may, for example, be the ratio of the maximum capacitance to the minimum capacitance. Additionally, due to the increase in the tuning range of the varactor 125, the Q factor of the varactor 125 may be increased while still maintaining a large tuning range. The Q factor may, for example, be increased by increasing the doping concentration of the well region 116 and/or by reducing the gate length L of the gate structure.

In some embodiments, a first separation $S_a$ between a top surface of the RESURF region 108 and bottom surfaces of the first and second contact regions 114, 118 is about 1-1000 nanometers, about 1-500 nanometers, about 500-1000 nanometers, or some other suitable value. Further, in some embodiments, the first separation $S_a$ is less than about 1000 nanometers, about 500 nanometers, about 10 nanometers, or some other suitable value. In some embodiments, a second separation $S_b$ between the top surface of the RESURF region 108 and a top surface of the substrate 102 is about 50-1000 nanometers, about 50-500 nanometers, about 500-1000 nanometers, or some other suitable value. In some embodiments, the well region 116 extends from a top surface of the substrate 102, into the substrate 102, to a depth $D_w$ that is about 10-1000 nanometers, about 10-500 nanometers, about 500-1000 nanometers, or some other suitable value. In some embodiments, the RESURF region 108 has a height H that is about 50-1000 nanometers, about 50-500 nanometers, about 500-1000 nanometers, or some other suitable value.

In some embodiments, the well region 116 is doped with N-type dopants and the RESURF region 108 is doped with P-type dopants. In other embodiments, the well region 116 is doped with the P-type dopants and the RESURF region 108 is doped with N-type dopants. The P-type dopants may, for example, be or comprise boron, difluoroboryl (e.g., $BF_2$), indium, some other suitable P-type dopants, or any combination of the foregoing. The N-type dopants of the well region 116 may, for example, be or comprise phosphorous, arsenic, antimony, some other suitable N-type dopants, or any combination of the foregoing. In some embodiments, a doping concentration of the well region 116 and/or a doping concentration of the RESURF region 108 is/are about $1 \times 10^{12}$ to about $1 \times 10^{16}$ atoms per cubic centimeter (atoms/cm$^3$), about $1 \times 10^{12}$ to about $1 \times 10^{14}$ atoms/cm$^3$, about $1 \times 10^{14}$ to about $1 \times 10^{16}$ atoms/cm$^3$, or some other suitable concentration. Such embodiments may, for example, arise when the well region 116 and/or the RESURF region 108 is/are formed by ion implantation. In some embodiments, a doping concentration of the well region 116 and/or a doping concentration of the RESURF region 108 is/are about $1 \times 10^{15}$ to about $1 \times 10^{20}$ atoms/cm$^3$, about $1 \times 10^{15}$ to about $1 \times 10^{17}$ atoms/cm$^3$, about $1 \times 10^{17}$ to about $1 \times 10^{20}$ atoms/ cm$^3$, or some other suitable concentration. Such embodiments may, for example, arise when the well region 116 and/or the RESURF region 108 is/are formed by epitaxy.

In some embodiments, the substrate 102 comprises a semiconductor substrate (not shown), and further comprises an epitaxial layer (not shown) overlying the semiconductor substrate. The semiconductor substrate may, for example, be a bulk monocrystalline silicon substrate, some other suitable bulk semiconductor substrate, a SOI substrate, or some other suitable semiconductor substrate. The epitaxial layer may, for example, be or comprise monocrystalline silicon and/or some other suitable semiconductor material(s). In some embodiments in which the substrate 102 comprises the epitaxial layer, the well region 116 and the RESURF region 108 may both be in the epitaxial layer. In other embodiments in which the substrate 102 comprises the epitaxial layer, the well region 116 is in the epitaxial layer and the RESURF region 108 is in the substrate 102. In some embodiment, the substrate 102 comprises the semiconductor substrate, a first epitaxial layer (not shown), and a second epitaxial layer (not shown), where the semiconductor substrate, the first epitaxial layer, and the second epitaxial layer are stacked with the first epitaxial layer between the semiconductor substrate and the second epitaxial layer. The first and second epitaxial layers may, for example, be or comprise monocrystalline silicon and/or some other suitable semiconductor material(s). In some embodiments in which the substrate 102 comprises the first and second epitaxial layers, RESURF and well regions 108, 116 are respectively in the second and first epitaxial layers.

With reference to FIG. 2A, a cross-sectional view 200a of some alternative embodiments of the IC of FIG. 1 is provided in which the RESURF region 108 directly contacts the first and second contact regions 114, 118 and has a top surface about even with bottom surfaces respectively of the first and second contact regions 114, 118. In some embodiments, if the RESURF region 108 directly contacts the first and second contact regions 114, 118, then an area of the well region 116 is reduced directly under the gate electrode 124, thereby facilitating full depletion of the substrate 102 below the gate electrode 124.

With reference to FIG. 2B, a cross-sectional view 200b of some alternative embodiments of the IC of FIG. 2A is provided in which a buried implant region 202 is in the substrate 102, under the RESURF region 108. In some embodiments, the buried implant region 202 has the same doping type as the well region 116 and hence an opposite doping type as the RESURF region 108. For example, the buried implant region 202 and the well region 116 may both be N-type, and the RESURF region 108 may be P-type, or vice versa. In such embodiments, a depletion region forms at an interface between the buried implant region 202 and the RESURF region 108, thereby facilitating electrical isolation between the varactor 125 and the bulk region 102b of the substrate 102. In some embodiments, the buried implant region 202 has the same doping type, but a lower doping concentration, than the well region 116. In some embodiments, the buried implant region 202 directly contacts the well region 116.

With reference to FIG. 2C, a cross-sectional view 200c of some alternative embodiments of the IC of FIG. 1 is provided in which the RESURF region 108 directly contacts the first and second contact regions 114, 118 and has a top surface elevated above bottom surfaces respectively of the first and second contact regions 114, 118.

Figure 2D:
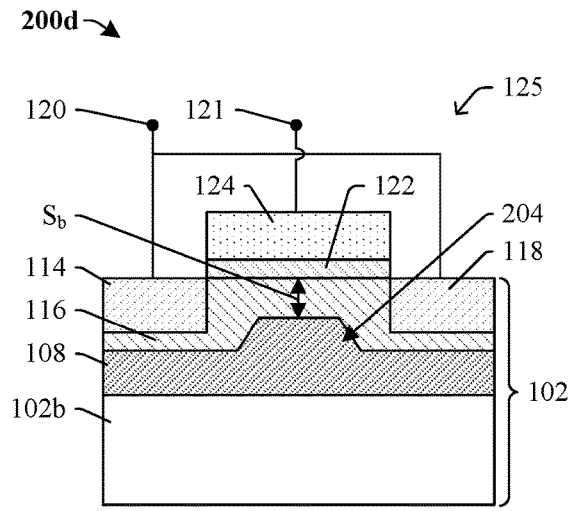

With reference to FIG. 2D, a cross-sectional view 200d of some alternative embodiments of the IC of FIG. 1 is provided in which the RESURF region 108 has an upward protrusion 204 extending upward toward the gate structure at a location directly under the gate structure. Further, the upward protrusion 204 remains spaced from the first and second contact regions 114, 118. In some embodiments, the upward protrusion 204 extends to a location elevated above bottom surfaces respectively of the first and second contact regions 114, 118. In some embodiments, if a top surface of the upward protrusion 204 is elevated above bottom surfaces respectively of the first and second contact regions 114, 118, then the second separation $S_b$ is reduced. This, in part, facilitates reaching full depletion of the substrate 102 more quickly.

Figure 2E:
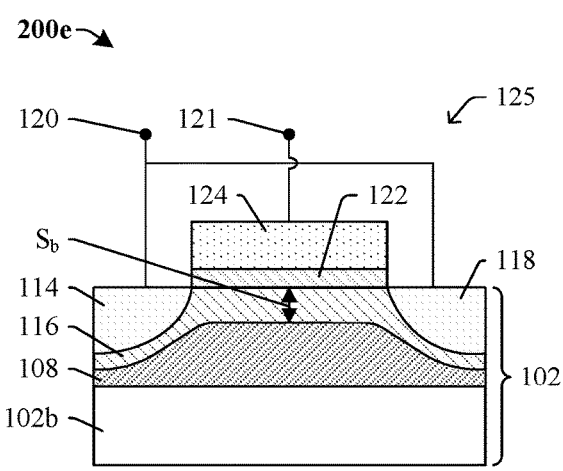

With reference to FIG. 2E, a cross-sectional view 200e of some alternative embodiments of the IC of FIG. 2D is provided in which the first and second contact regions 114, 118 are rounded. Further, the upward protrusion 204 is rounded to conform to the first and second contact regions 114, 118, while remaining spaced from the first and second contact regions 114, 118 by the well region 116.

As seen in each of FIGS. 2C-2D, a top surface of the RESURF region 108 is elevated above bottom surfaces respectively of the first and second contact regions 114, 118. In some embodiments, this reduces the second separation $S_b$. This, in part, facilitates reaching full depletion of the substrate 102 more quickly.

While the buried implant region 202 of FIG. 2B is illustrated using embodiments of the varactor 125 in FIG. 2A, it is to be understood that the buried implant region 202 may be used with embodiments of the varactor 125 in any one of FIGS. 1 and 2C-2E. As such, the buried implant region 202 may be directly under the RESURF region 108 in any one of FIGS. 1 and 2C-2E. While the upward protrusion 204 of FIG. 2D is illustrated using embodiments of the varactor 125 in FIG. 1, the upward protrusion 204 may be used with embodiments of the varactor 125 in any one of FIGS. 2A-2C. Similarly, while the upward protrusion 204 of FIG. 2E is illustrated using embodiments of the varactor 125 in FIG. 1, the upward protrusion 204 may be used with embodiments of the varactor 125 in any one of FIGS. 2A-2C.

Figure 3A:
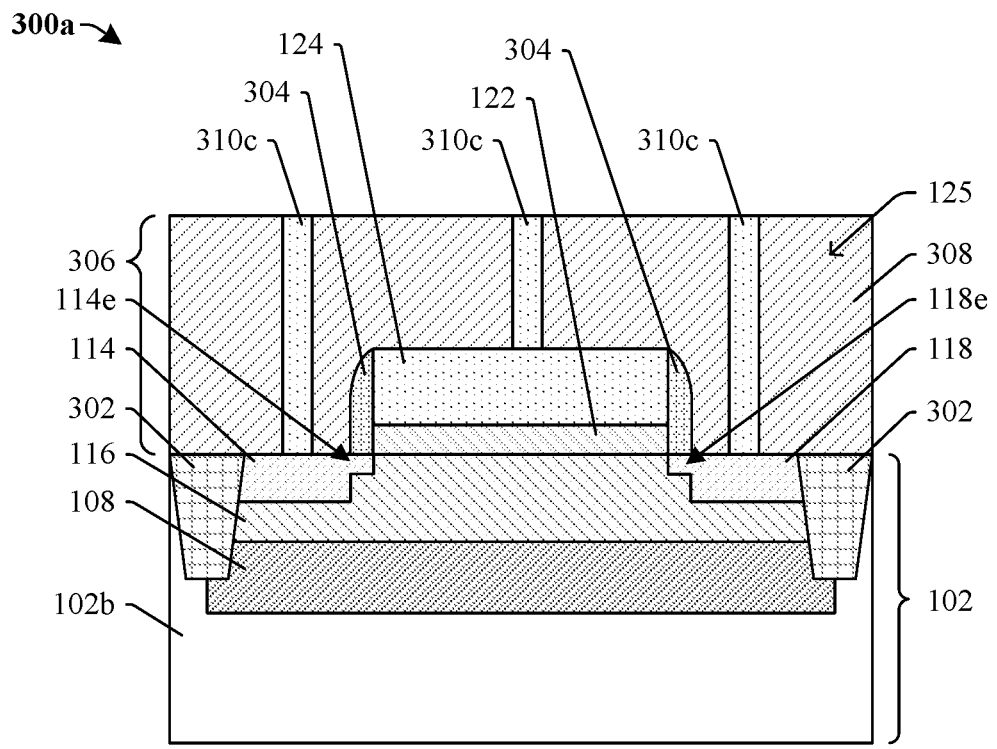
FIGS. 3A and 3B illustrate cross-sectional views of various more detailed embodiments of the IC of FIG. 1 in which the IC comprises additional features.

With reference to FIG. 3A a cross-sectional view 300a of some more detailed embodiments of the IC of FIG. 1 is provided in which an isolation structure 302 extends into an upper or top surface of the substrate 102 to provided electrical isolation between the varactor 125 and neighboring devices. The isolation structure 302 includes a pair of isolation segments respectively on opposite sides of the varactor 125, and the varactor 125 is sandwiched between the isolation segments. In some embodiments, the isolation structure 302 comprises a dielectric material, and/or is a shallow trench isolation (STI) structure, a deep trench isolation structure (DTI), or some other suitable isolation structure.

A sidewall spacer 304 is on sidewalls of the gate electrode 124 and the gate dielectric layer 122, and comprises a pair of sidewall spacer segments. The sidewall segments respectively overlie a first extension region 114e of the first contact region 114 and a second extension region 118e of the second contact region 118. The sidewall spacer 304 is dielectric and may be or comprise, for example, silicon oxide, silicon nitride, silicon oxynitride, some other suitable dielectric, or any combination of the foregoing.

An interconnect structure 306 covers the varactor 125 and comprises an interconnect dielectric layer 308 and a plurality of contact vias 310c. The interconnect dielectric layer 308 accommodates a plurality of contact vias 310c and may, for example, be or comprise silicon oxide, a low κ dielectric, some other suitable dielectric(s), or any combination of the foregoing. As used herein, a low κ dielectric may be, for example, a dielectric with a dielectric constant κ less than about 3.9, 3, 2, or 1. The contact vias 310c respectively overlie and are electrically coupled to the gate electrode 124 and the first and second contact regions 114, 118. The high doping concentration of the first and second contact regions 114, 118, relative to the well region 116, and/or silicide (not shown) on the first and second contact regions 114, 118 may, for example, provide ohmic coupling between the first and second contact regions 114, 118 and respective ones of the contact vias 310c. The contact vias 310c may, for example, be or comprise copper, aluminum copper, aluminum, tungsten, some other metal and/or conductive material(s), or any combination of the foregoing.

Figure 3B:
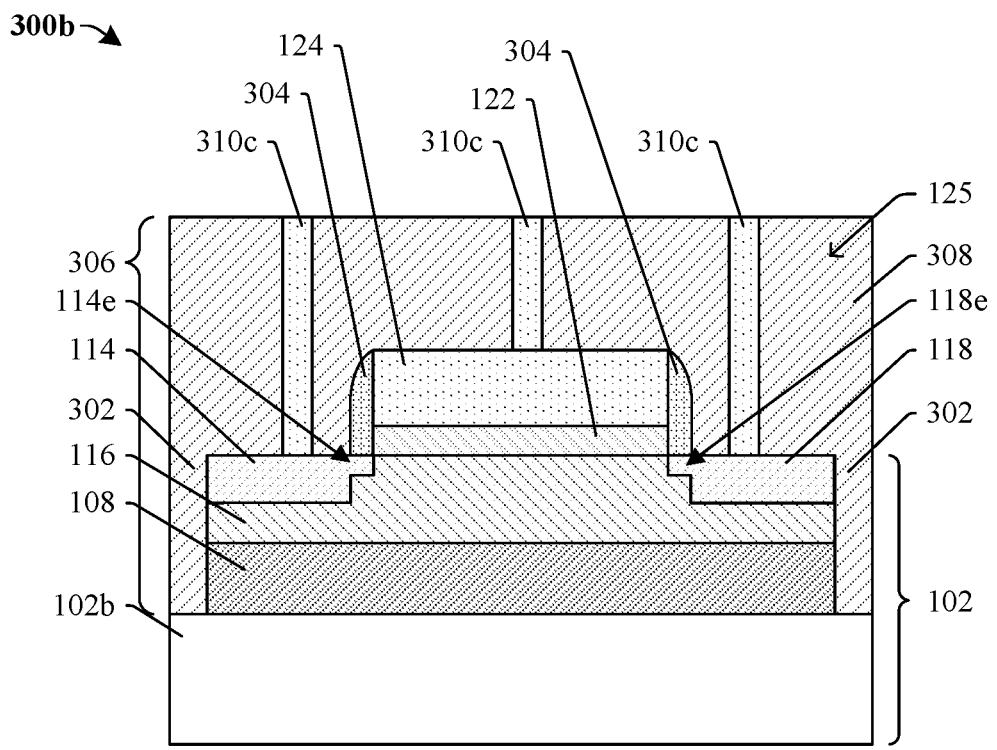

With reference to FIG. 3B, a cross-sectional view 300b of some alternative embodiments of the IC of FIG. 3A is provided in which the isolation structure 302 is omitted and the varactor 125 is formed on a mesa.

Figure 4:
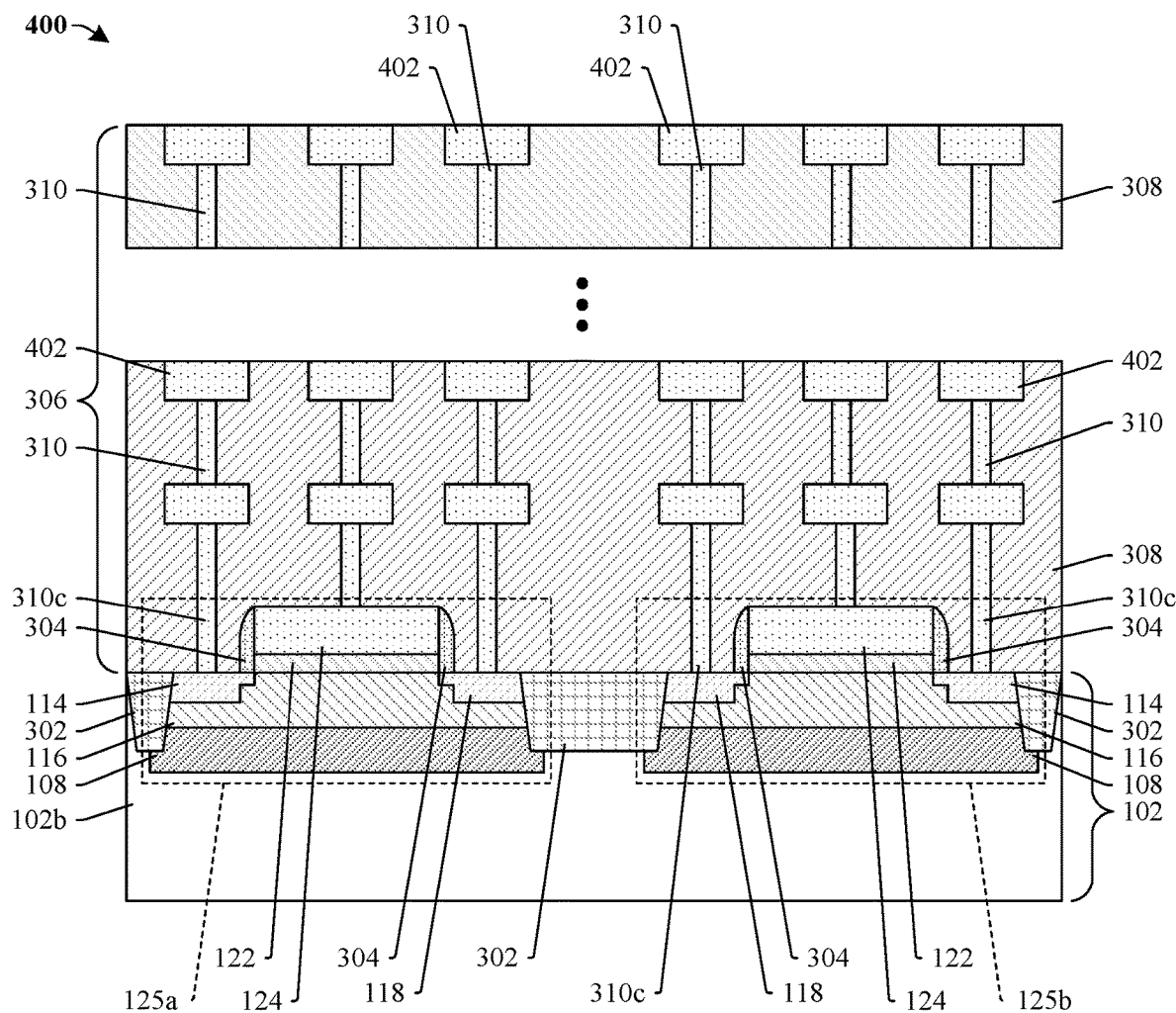
FIG. 4 illustrates a cross-sectional view of some embodiments of an IC including a pair of MOS varactors.

With reference to FIG. 4, a cross-sectional view 400 of some embodiments of an IC comprising a first varactor 125a and a second varactor 125b is provided. The first and second varactors 125a, 125b are each as the varactor 125 of FIG. 3A is illustrated and described, whereby the first and second varactors 125a, 125b each comprise a well region 116 and a RESURF region 108. In some embodiments, the RESURF and well regions 108, 116 of the first varactor 125a are respectively P-type and N-type, whereas the RESURF and well regions 108, 116 of the second varactor 125b are respectively N-type and P-type, or vice versa.

The interconnect structure 306 comprises a plurality of vias 310, including the contact vias 310c, and further includes a plurality of wires 402. For ease of illustration, only some of the vias 310 are labeled 310, and only some of the wires 402 are labeled 402. Further, only some of the contact vias 310c are labeled 310c. The vias 310 and the wires 402 are alternatingly stacked in the interconnect dielectric layer 308 to define conductive paths. For example, the vias 310 and the wires 402 may define a first conductive path electrically shorting the first and second contact regions 114, 118 of the first varactor 125a and/or may define a second conductive path electrically shorting the first and second contact regions 114, 118 of the second varactor 125b.

While the ICs of FIGS. 3A and 3B are illustrated using embodiments of the varactor 125 in FIG. 1, it is to be understood that embodiments of the varactor 125 in any one of FIGS. 2A-2E may alternatively be used in FIGS. 3A and 3B. Similarly, while the IC of FIG. 4 is illustrated using embodiments of the varactor 125 in FIG. 1, it is to be understood that embodiments of the varactor 125 in any one of FIGS. 2A-2E may alternatively be used in FIG. 4.

Figure 6:
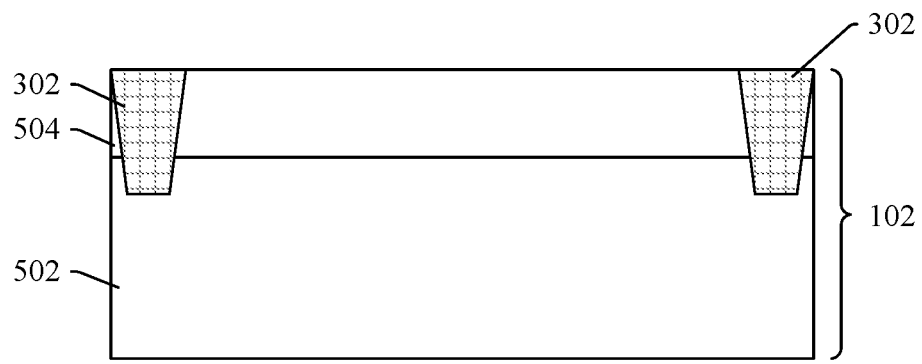
Figure 7A:
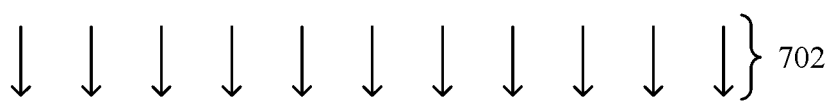
Figure 7A:
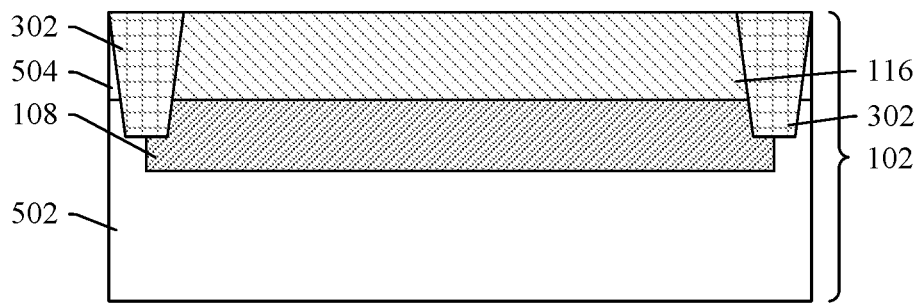
Figure 7B:
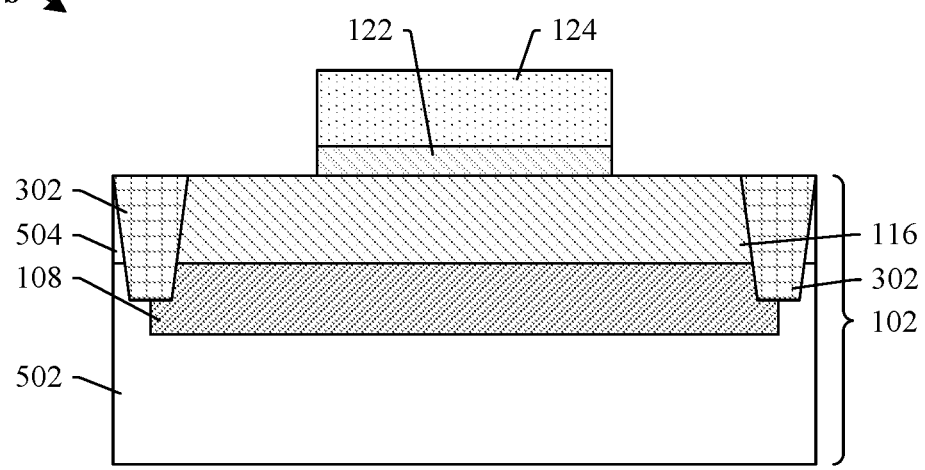
Figure 8A:
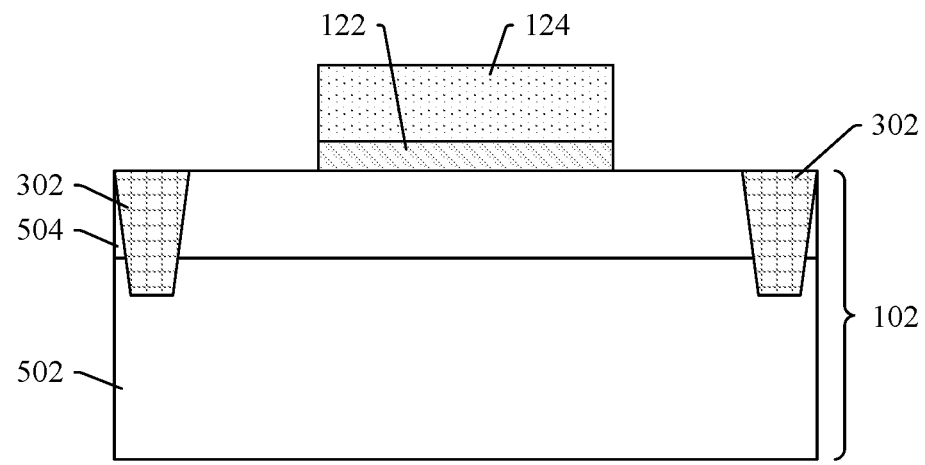
Figure 8B:
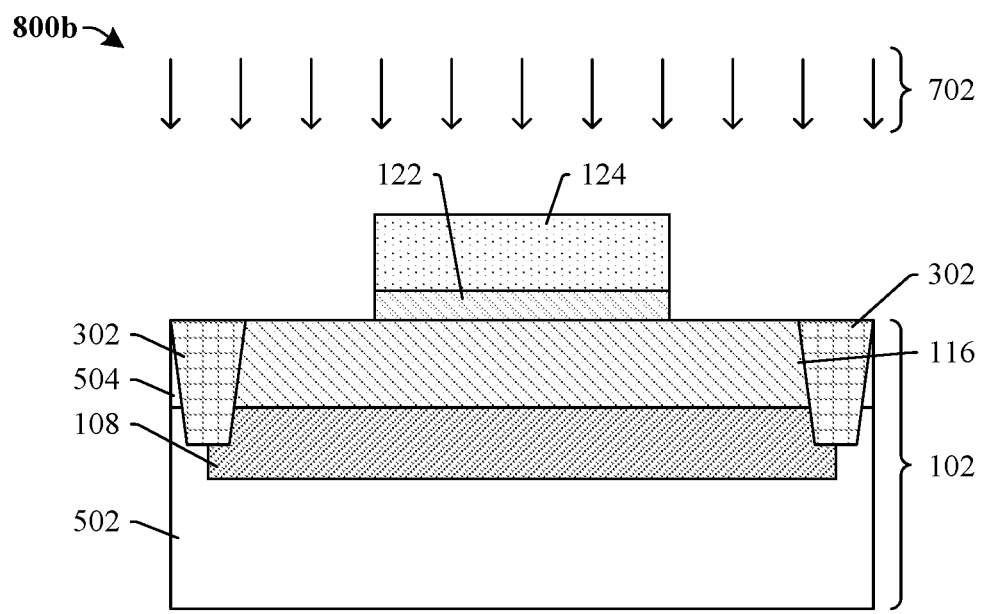

With reference to FIGS. 5, 6, 7A, 7B, 8A, 8B and 9-12, cross-sectional views 500, 600, 700a, 700b, 800a, 800b and 900-1200 of various embodiments of a method for forming an IC including a varactor with a RESURF region are provided. The method is illustrated using embodiments of the varactor in FIG. 3A. Notwithstanding this, the method may be used to form embodiments of the varactor in any one of FIGS. 1, 2A-2E, and 3B. Additionally, as seen hereafter, FIGS. 8A and 8B are alternatives to FIGS. 7A and 7B. Therefore, the method may proceed from FIGS. 5 and 6 to FIGS. 7A and 7B, and then from FIGS. 7A and 7B to FIGS. 9-12 (skipping FIGS. 8A and 8B), in gate last embodiments of the method. Further, the method may proceed from FIGS. 5 and 6 to FIGS. 8A and 8B (skipping FIGS. 7A and 7B), and then from FIGS. 8A and 8B to FIGS. 9-12, in gate first embodiments of the method.

Although the cross-sectional views 500, 600, 700a, 700b, 800a, 800b and 900-1200 shown in FIGS. 5, 6, 7A, 7B, 8A, 8B and 9-12 are described with reference to a method, it will be appreciated that the structures shown in FIGS. 5, 6, 7A, 7B, 8A, 8B and 9-12 are not limited to the method but rather may stand alone separate of the method. Although FIGS. 5, 6, 7A, 7B, 8A, 8B and 9-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
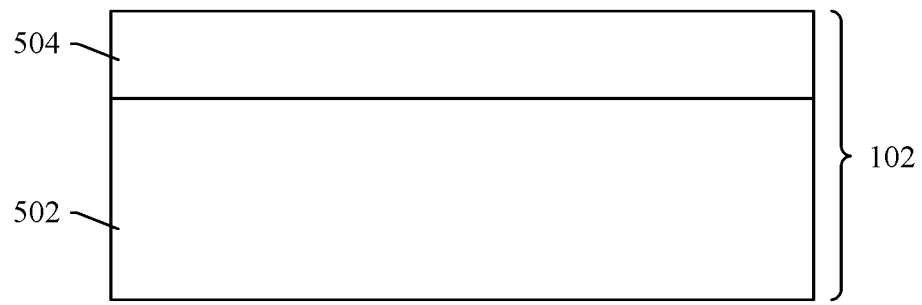
FIGS. 5, 6, 7A, 7B, 8A, 8B and 9-12 illustrate cross-sectional views of various embodiments of a method for forming an IC including a varactor with a RESURF region.

As illustrated by the cross-sectional view 500 of FIG. 5, a substrate 102 is provided. In some embodiments, the substrate 102 comprises a semiconductor substrate 502 and an epitaxial layer 504. The semiconductor substrate 502 may, for example, be a bulk monocrystalline silicon substrate, some other suitable bulk semiconductor substrate, a silicon-on-insulator (SOI) substrate, or some other suitable semiconductor substrate. The epitaxial layer 504 may, for example, be or comprise monocrystalline silicon and/or some other suitable semiconductor material(s). In other embodiments, the epitaxial layer 504 is omitted, such that the substrate 102 and the semiconductor substrate 502 are one and the same.

In embodiments in which the substrate 102 comprises the epitaxial layer 504, the providing of the substrate 102 may, for example, comprise forming the epitaxial layer 504 on the semiconductor substrate 502. The epitaxial layer 504 may, for example, be formed by molecular beam epitaxy (MBE), vapor phase epitaxy (VPE), liquid phase epitaxy (LPE), some other suitable epitaxial process, or any combination of the foregoing.

As illustrated by cross-sectional view 600 of FIG. 6, an isolation structure 302 is formed. The isolation structure 302 extends into an upper or top surface of the substrate 102 and comprises a pair of isolation segments that are laterally spaced. Further, the isolation structure 302 comprises silicon oxide and/or some other suitable dielectric material(s). In some embodiments, the forming of the isolation structure 302 comprises patterning the substrate 102 to form a trench and filling the trench with a dielectric material.

As illustrated by the cross-sectional view 700a of FIG. 7A, a RESURF region 108 and a well region 116 are formed in the substrate 102, such that the well region 116 overlies the RESURF region 108. Further, the well region 116 and the RESURF region 108 are formed with opposite doping types. The RESURF region 108 and the well region 116 may, for example, be formed by ion implantation and/or some other suitable doping process(es) in which dopants 702 are added to the substrate 102. In some embodiments, the RESURF region 108 is formed before the well region 116. In other embodiments, the well region 116 is formed before the RESURF region 108. In some embodiments, the well region 116 is doped with N-type dopants and the RESURF region 108 is doped with P-type dopants. In other embodiments, the well region 116 is doped with the P-type dopants and the RESURF region 108 is doped with N-type dopants. The P-type dopants may, for example, be or comprise boron, difluoroboryl, indium, some other suitable P-type dopants, or any combination of the foregoing. The N-type dopants of the well region 116 may, for example, be or comprise phosphorous, arsenic, antimony, some other suitable N-type dopants, or any combination of the foregoing. In some embodiments, a doping concentration of the well region 116 and/or a doping concentration of the RESURF region 108 is/are about $1 \times 10^{12}$ to about $1 \times 10^{16}$ atoms/cm$^3$, about $1 \times 10^{12}$ to about $1 \times 10^{14}$ atoms/cm$^3$, about $1 \times 10^{14}$ to about $1 \times 10^{16}$ atoms/cm$^3$, or some other suitable concentration.

While the RESURF region 108 and the well region 116 are illustrated as respectively being formed in the epitaxial layer 504 and the semiconductor substrate 502, the RESURF region 108 and the well region 116 may both be formed in the epitaxial layer 504 in alternative embodiments. Further, while the RESURF region 108 and the well region 116 are illustrated as being formed after the isolation structure 302, the isolation structure 302 may be formed after the RESURF region 108 and the well region 116 in alternative embodiments. While the RESURF region 108 and the well region 116 are respectively illustrated as regions respectively of the semiconductor substrate 502 and the epitaxial layer 504, the RESURF region 108 and the well region 116 may, for example, be discrete epitaxial layers formed over the semiconductor substrate 502 in alternative embodiments.

As illustrated by the cross-sectional view 700b of FIG. 7B, a gate dielectric layer 122 and a gate electrode 124 are formed stacked on the well region 116. The gate dielectric layer 122 may, for example, be or comprise silicon oxide, hafnium oxide, some other suitable high κ dielectric, some other suitable dielectric, or any combination of the foregoing. As used herein, a high κ dielectric may be, for example, a dielectric with a dielectric constant κ greater than about 3.9, 10, or 20. The gate electrode 124 may, for example, be or comprise doped polysilicon, metal, some other suitable conductive material, or any combination of the foregoing.

In some embodiments, a process for forming the gate dielectric layer 122 and the gate electrode 124 comprises depositing a dielectric layer on the substrate 102, depositing a conductive layer over the dielectric layer, and patterning the dielectric layer and the conductive layer into the gate dielectric layer 122 and the gate electrode. The depositing may, for example, be performed by chemical vapor deposition (CVD), physical vapor deposition (PVD), some other suitable deposition process(es), or any combination of the foregoing. The patterning may, for example, be performed by a photolithography/etching process and/or some other suitable patterning process(es).

As noted above, FIGS. 7A and 7B pertain to gate last embodiments of the method since the gate dielectric layer 122 and the gate electrode 124 are formed after the well region 116 and the RESURF region 108. The acts at FIGS. 8A and 8B may alternatively be performed in place of the acts at FIGS. 7A and 7B for gate first embodiments of the method in which the gate dielectric layer 122 and the gate electrode 124 are formed before the well region 116 and the RESURF region 108.

As illustrated by the cross-sectional view 800a of FIG. 8A, the gate dielectric layer 122 and the gate electrode 124 are formed stacked on the substrate 102. The gate dielectric layer 122 and the gate electrode 124 may, for example, be performed as described with regard to FIG. 7B. As illustrated by the cross-sectional view 800b of FIG. 8B, the RESURF region 108 and the well region 116 are formed in the substrate 102, through the gate dielectric layer 122 and the gate electrode 124. The well region 116 and the RESURF region 108 may, for example, be formed as described with regard to FIG. 7A. While the RESURF region 108 and the well region 116 are illustrated as respectively being formed in the epitaxial layer 504 and the semiconductor substrate 502, the RESURF region 108 and the well region 116 may both be formed in the epitaxial layer 504 in alternative embodiments. In some embodiments, after performing the ion implantation process to form the aforementioned regions, an annealing process may be performed to activate the implanted dopants.

In some embodiments, the gate first embodiments illustrated and described in FIGS. 8A and 8B may reduce the amount of thermal processing that the RESURF region 108 and the well region 116 are exposed to. For example, because the RESURF region 108 and the well region 116 are formed after the gate dielectric layer 122 and the gate electrode 124 are formed, the RESURF region 108 and the well region 116 are not exposed to thermal processes uses while forming the gate dielectric layer 122 and the gate electrode 124. By reducing the amount of thermal processing that the RESURF region 108 and the well region 116 are exposed to, diffusion of dopants in the RESURF region 108 and the well region 116 is reduced and hence a doping profile of the RESURF region 108 and the well region 116 may be more tightly controlled. This, in turn, may enhance performance of the varactor being formed.

Figure 9:
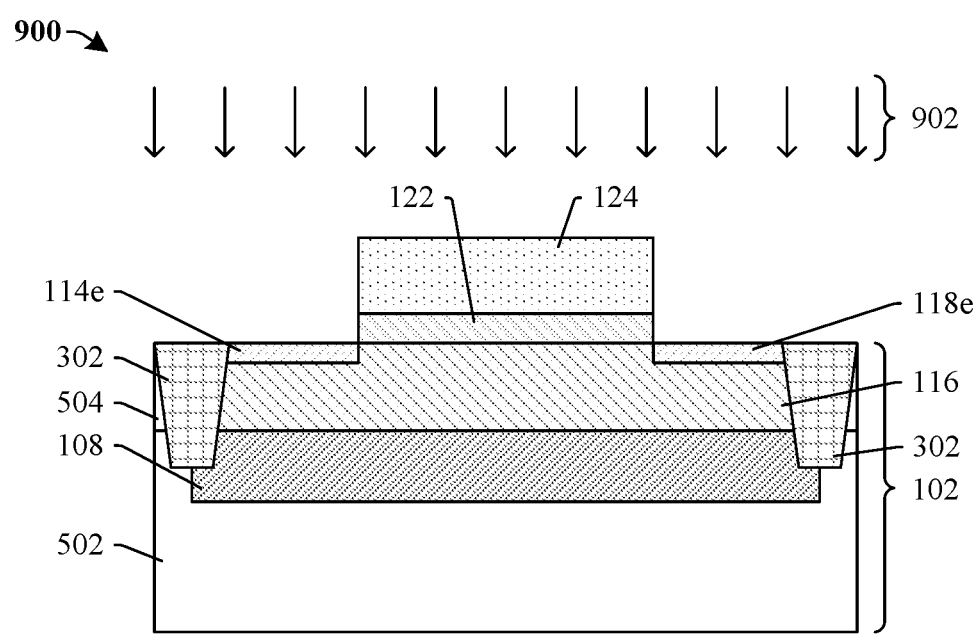

Regardless of whether the acts at FIGS. 7A and 7B are performed, or the acts of FIGS. 8A and 8B are performed, the method next proceeds to the acts at FIG. 9. As illustrated by the cross-sectional view 900 of FIG. 9, a first extension region 114e and a second extension region 118e are formed in the substrate 102, overlying the well region 116. Further, the first and second extension regions 114e, 118e are formed respectively along opposite sidewalls of the gate electrode 124. The first and second extension regions 114e, 118e have the same doping type as the well region 116 and, in some embodiments, have a greater doping concentration than the well region 116. For example, the first and second extension regions 114e, 118e and the well region 116 may be N-type. The first and second extension regions 114e, 118e may, for example, be formed by ion implantation and/or some other suitable doping process(es) in which dopants 902 are added to the substrate 102.

Figure 10:
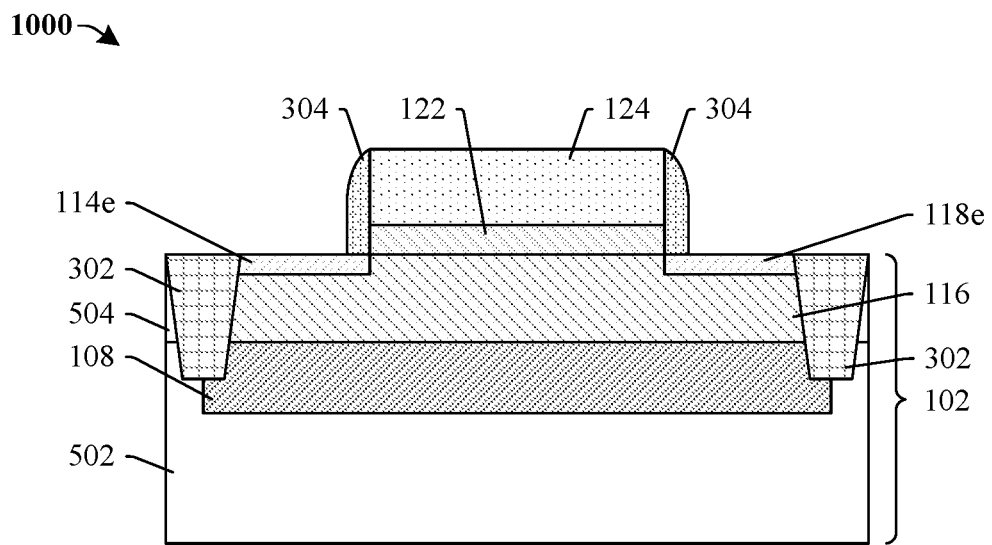

As illustrated by the cross-sectional view 1000 of FIG. 10, a sidewall spacer 304 is formed on sidewalls of the gate electrode 124 and comprises a pair of sidewall spacer segments. The sidewall spacer segments respectively overlying the first and second extension regions 114e, 118e and are respectively on opposite sidewalls of the gate electrode 124. In some embodiments, a process for forming the sidewall spacer 304 comprises depositing a dielectric layer covering the gate electrode 124 and lining sidewalls of the gate electrode 124, and subsequently performing an etch back into the dielectric layer to form the sidewall spacer 304.

Figure 11:
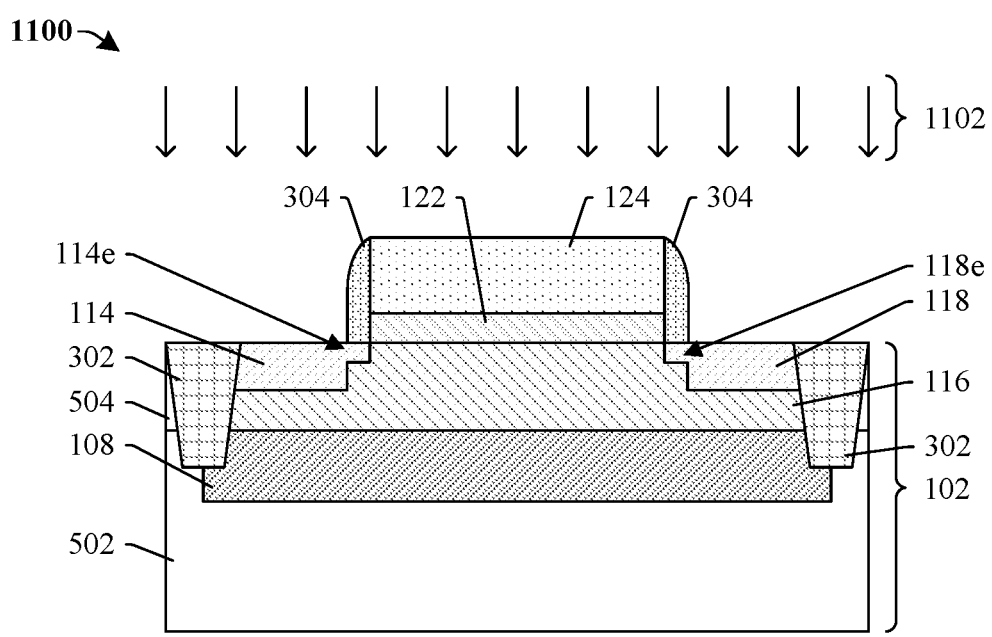

As illustrated by the cross-sectional view 1100 of FIG. 11, a first contact region 114 and a second contact region 118 are formed in the substrate 102, respectively overlapping with the first and second extension regions 114e, 118e. The first and second contact regions 114, 118 have the same doping type as the first and second extension regions 114e, 118e, but have a greater doping concentration than the first and second extension regions 114e, 118e. The first and second contact regions 114, 118 may, for example, be formed by ion implantation and/or some other suitable doping process(es) in which dopants 1102 are added to the substrate 102.

Figure 12:
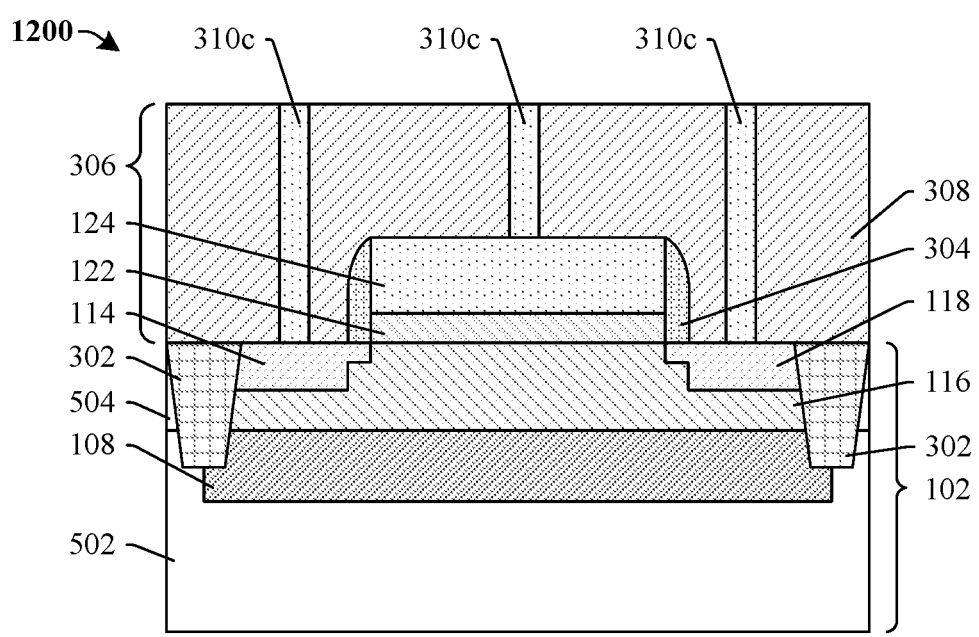

As illustrated by the cross-sectional view 1200 of FIG. 12, an interconnect structure 306 is formed over the structure of FIG. 11. The interconnect structure 306 is only partially shown, comprising an interconnect dielectric layer 308 and a plurality of contact vias 310c. The contact vias 310c are in the interconnect dielectric layer 308 and extend respectively from the gate electrode 124 and the first and second contact regions 114, 118. The interconnect dielectric layer 308 may, for example, be formed by CVD, PVD, some other suitable deposition process(es), or any combination of the foregoing. The contact vias 310c may, for example, be formed by: patterning the interconnect dielectric layer 308 to form via openings with a pattern of the contact vias 310c; depositing a conductive layer filling the via openings and covering the interconnect dielectric layer 308; and performing a planarization into the conductive layer until the interconnect dielectric layer 308 is reached. The patterning may, for example, be performed by a photolithography/etching process and/or some other suitable patterning process(es). The depositing may, for example, be performed by CVD, PVD, electroless plating, electroplating, some other suitable deposition process(es), or any combination of the foregoing. The planarization may, for example, be performed by a CMP and/or some other suitable planarization process(es).

Figure 13:
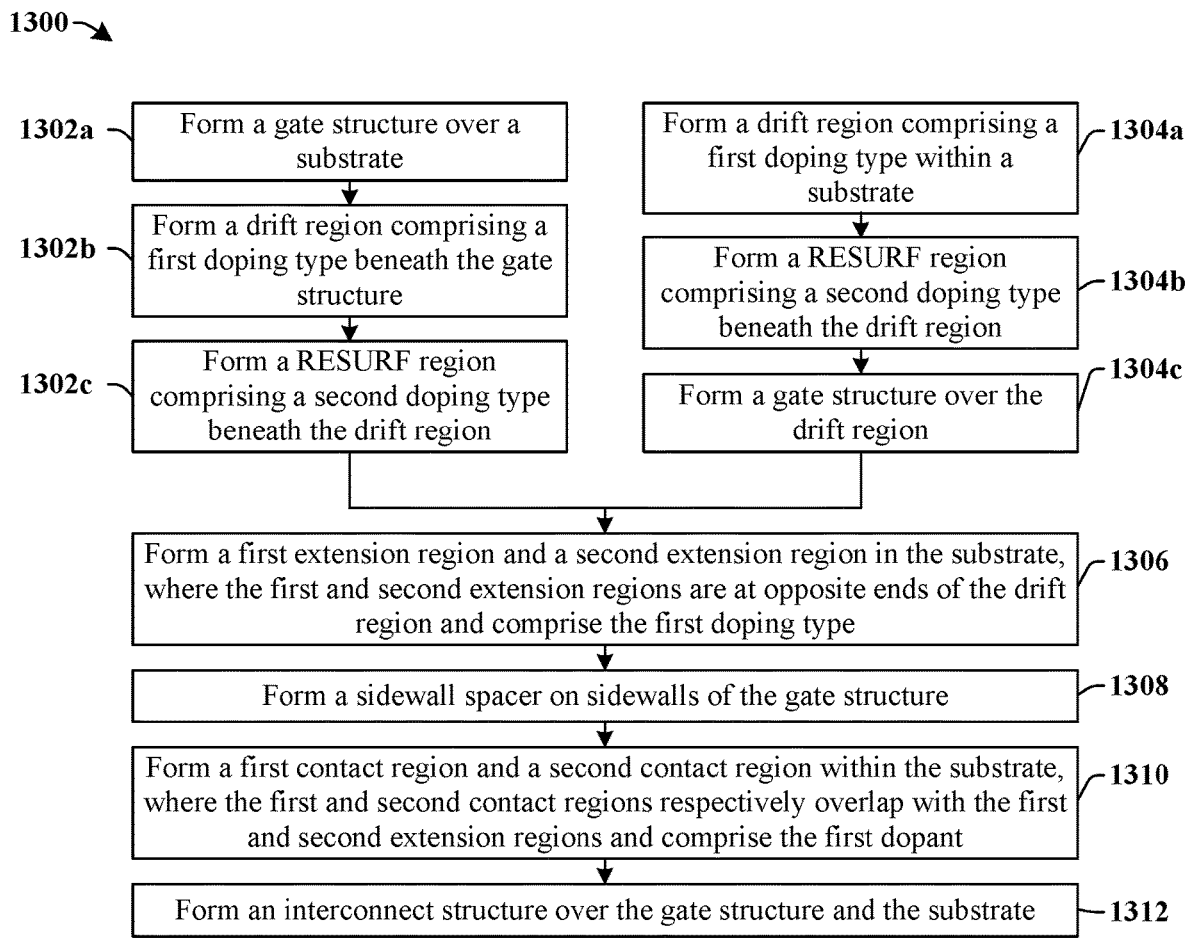
FIG. 13 illustrates a block diagram of some embodiments of the method of FIGS. 5, 6, 7A, 7B, 8A, 8B and 9-12.

With reference to FIG. 13, a block diagram 1300 of some embodiments of a method 1300 for the method of FIGS. 5, 6, 7A, 7B, 8A, 8B and 9-12 is provided. In gate first embodiments of the method, the acts at 1302a-1302c are performed. In gate last embodiments of the method, the acts 1304a-1304c are performed in place of the acts at 1302a-1302c.

At 1302a, a gate structure is formed over a substrate. FIG. 8A illustrates a cross-sectional view 800a corresponding to some embodiments of act 1302a.

At 1302b, a drift region comprising a first doping type is formed beneath the gate structure. FIG. 8B illustrates a cross-sectional view 800b corresponding to some embodiments of act 1302b.

At 1302c, a RESURF region comprising a second doping type is formed beneath the drift region. FIG. 8B illustrates a cross-sectional view 800b corresponding to some embodiments of act 1302c. In alternative embodiments, the ordering of 1302b and 1302c is reversed, such that the drift region is formed after the RESURF region.

At 1304a, a drift region comprising a first doping type is formed within a substrate. FIG. 7A illustrates a cross-sectional view 700a corresponding to some embodiments of act 1304a.

At 1304b, a RESURF region comprising a second doping type is formed beneath the drift region. FIG. 7A illustrates a cross-sectional view 700a corresponding to some embodiments of act 1304b.

At 1304c, a gate structure is formed over the drift region. FIG. 7B illustrates a cross-sectional view 700b corresponding to some embodiments of act 1304c. In alternative embodiments, the ordering of 1304b and 1304c is reversed, such that the drift region is formed after the RESURF region.

Regardless of whether the acts at 1302a-1302c are performed or the acts at 1304a-1304c are performed, the acts at 1306-1310 are next performed.

At 1306, a first extension region and a second extension region are formed in the substrate, where the first and second extension regions comprise the first doping type and are formed at opposite ends of the drift region. FIG. 9 illustrates a cross-sectional view 900 corresponding to some embodiments of act 1306.

At 1308, a sidewall spacer is formed on sidewalls of the gate structure. FIG. 10 illustrates a cross-sectional view 1000 corresponding to some embodiments of act 1308.

At 1310, a first contact region and a second contact region are formed respectively overlapping the first and second extension regions, where the first and second contact regions comprise the first doping type. FIG. 11 illustrates a cross-sectional view 1100 corresponding to some embodiments of act 1310.

At 1312, an interconnect structure is formed over the first and second contact regions and the gate structure. FIG. 12 illustrates a cross-sectional view 1200 corresponding to some embodiments of act 1312.

Although the method 1300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Figure 14:
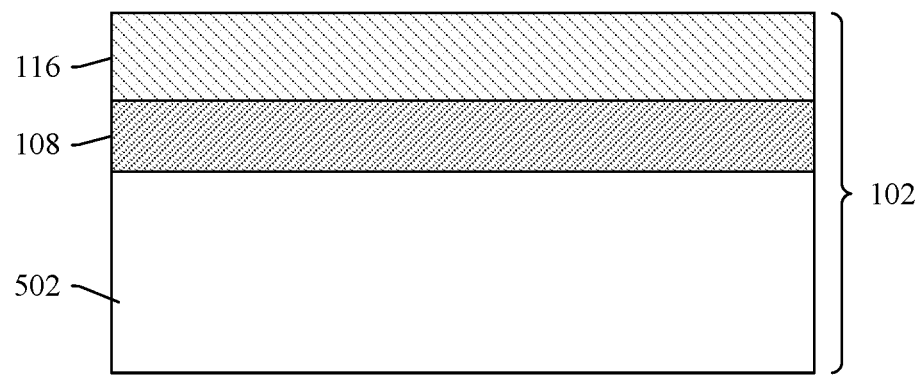
FIG. 14 illustrates a cross-sectional view of some embodiments of a method for forming a RESURF region and a well region by epitaxy.

With reference to FIG. 14, a cross-sectional view 1400 illustrates acts that may be performed in place of the acts at FIGS. 5, 6, and 7A, such that the method of FIGS. 5, 6, 7A, 7B, 8A, 8B and 9-12 may alternatively proceed from FIG. 14 to FIG. 7B, and then from FIG. 7B to FIGS. 9-12 (skipping FIGS. 8A and 8B). As illustrated by the cross-sectional view 1400 of FIG. 14, the RESURF region 108 is formed on the semiconductor substrate 502 by epitaxy, and the well region 116 is later formed on the RESURF region 108 by epitaxy. As such, the RESURF region 108 is a discrete epitaxial layer, and the well region 116 is a discrete epitaxial layer. Further, the RESURF region 108, the well region 116, and the semiconductor substrate 502 collectively define the substrate 102 for purposes of performing the acts at FIGS. 7B and 9-12.

The epitaxy of the RESURF region 108 and/or the epitaxy of the well region 116 may, for example, be formed by MBE, VPE, LPE, some other suitable epitaxial process, or any combination of the foregoing. Further, while performing the epitaxy of the RESURF region 108 and/or the epitaxy of the well region 116, doping is simultaneously performed. In some embodiments, a doping concentration of the well region 116 and/or a doping concentration of the RESURF region 108 is/are about $1 \times 10^{15}$ to about $1 \times 10^{20}$ atoms/cm$^3$, about $1 \times 10^{15}$ to about $1 \times 10^{17}$ atoms/cm$^3$, about $1 \times 10^{17}$ to about $1 \times 10^{20}$ atoms/cm$^3$, or some other suitable concentration.

Figure 15A:
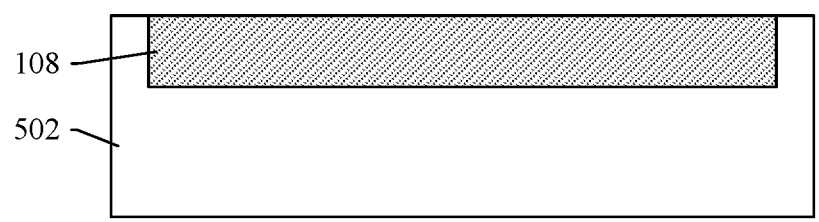
FIGS. 15A and 15B illustrates cross-sectional views of some embodiments of a method for forming a RESURF region and well region in which the well region is formed in an epitaxial layer formed after the RESURF region.
Figure 15B:
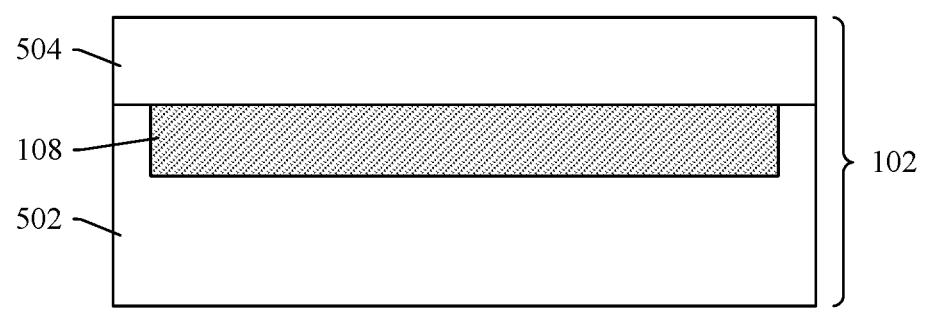

With reference to FIGS. 15A and 15B, cross-sectional views 1500a and 1500b illustrate acts that may be performed in place of the acts at FIGS. 5 and 6. As such, the method of FIGS. 5, 6, 7A, 7B, 8A, 8B and 9-12 may alternatively proceed from FIGS. 15A and 15B to FIGS. 7A and 7B, and then from FIGS. 7A and 7B to FIGS. 9-12 (skipping FIGS. 8A and 8B), in gate last embodiments of the method. Further, the method of FIGS. 5, 6, 7A, 7B, 8A, 8B and 9-12 may alternatively proceed from FIGS. 15A and 15B to FIGS. 8A and 8B, and then from FIGS. 8A and 8B to FIGS. 9-12 (skipping FIGS. 7A and 7B), in gate first embodiments of the method.

As illustrated by the cross-sectional view 1500a of FIG. 15A, the RESURF region 108 is formed in a semiconductor substrate 502. The RESURF region 108 may, for example, be formed as described with regard to FIG. 7A.

As illustrated by the cross-sectional view 1500b of FIG. 15B, the epitaxial layer 504 is formed on the semiconductor substrate 502 and the RESURF region 108. The epitaxial layer 504 may, for example, be formed by MBE, VPE, LPE, some other suitable epitaxial process, or any combination of the foregoing.

As noted above, the acts at FIGS. 7A and 7B may next be performed for gate last embodiments, or the acts of FIGS. 8A and 8B may next be performed for gate first embodiments. Since the RESURF region 108 has already been formed, there is no forming of the RESURF region 108 while performing the acts at FIGS. 7A and 7B or the acts at FIGS. 8A and 8B.

Accordingly, in some embodiments, the present application relates to a varactor that comprises a RESURF region (or layer) formed directly below a drift region (or layer).

In some embodiments, the present application provides a varactor including: a drift region is in a substrate and has a first doping type; a gate structure is above the drift region; a pair of contact regions is in the substrate, overlying the drift region, wherein the contact regions have the first doping type, and wherein the gate structure is laterally sandwiched between the contact regions; a RESURF region in the substrate, below the drift region, wherein the RESURF region has a second doping type, and wherein the second doping type is opposite the first doping type.

In some embodiments, the present application provides an IC including: a substrate including a first doped region having a first doping type, and further including a second doped region have a second doping type opposite the first doping type, wherein the second doped region overlies the first doped region and contacts the first doped region at a PN-junction, and wherein the second doped region extends from the first doped region to a top surface of the semiconductor substrate; and a gate dielectric layer and a gate electrode stacked on the top surface of the semiconductor substrate, overlying the second doped region.

In some embodiments, the present application provides a method for forming a varactor, the method including: forming a RESURF region having a first doping type within a substrate; forming a drift region having a second doping type within the substrate, wherein the drift region and the RESURF region are formed so the RESURF region is below the drift region; forming a gate structure on the substrate; and forming a pair of contact regions in the substrate and overlying the drift region, wherein the contact regions are formed respectively on opposite sides of the gate structure and have the second doping type, and wherein the first doping type is opposite the second doping type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A varactor comprising:
a drift region is in a substrate and has a first doping type;
a gate structure is above the drift region;
a pair of contact regions is in the substrate, overlying the drift region, wherein the contact regions have the first doping type, and wherein the gate structure is laterally sandwiched between the contact regions, and wherein the drift region continuously laterally extends from a sidewall of a first contact region in the pair of contact regions to a sidewall of a second contact region in the pair of contact regions; and
a RESURF region in the substrate, below the drift region, wherein the RESURF region has a second doping type, and wherein the second doping type is opposite the first doping type.

2. The varactor of claim 1, wherein the first doping type is n-type and the second doping type is p-type.

3. The varactor of claim 1, wherein the RESURF region comprises boron, indium, or difluoroboron ($BF_2$), and wherein the drift region comprises phosphorus, arsenic, or antimony.

4. The varactor of claim 1, wherein the first doping type is p-type and the second doping type is n-type.

5. The varactor of claim 1, wherein the drift region comprises boron, indium, or difluoroboron ($BF_2$), and wherein the RESURF region comprises phosphorus, arsenic, or antimony.

6. The varactor of claim 1, wherein the RESURF region is in direct contact with the contact regions.

7. The varactor of claim 1, wherein the RESURF region protrudes upward to a location directly under the gate structure and elevated above a bottom of the contact regions.

8. The varactor of claim 1, wherein the RESURF region is spaced from the contact regions.

9. The varactor of claim 1, further comprising:
a doped region in the substrate, directly below the RESURF region, and comprising the first doping type.

10. The varactor of claim 1, wherein the contact regions have a higher doping concentration than the drift region.

11. An integrated circuit (IC) comprising:
a semiconductor substrate comprising a first doped region having a first doping type, a second doped region having a second doping type opposite the first doping type, and a pair of contact regions having the second doping type, wherein the second doped region overlies the first doped region and contacts the first doped region at a PN-junction, wherein the second doped region extends from the first doped region to a top surface of the semiconductor substrate, wherein the contact regions overlie the first doped region, and wherein the first doped region comprises an upward protrusion that extends to a location elevated above a bottom surface of the contact regions; and
a gate structure comprising a gate dielectric layer and a gate electrode stacked on the top surface of the semiconductor substrate, overlying the second doped region.

12. The IC of claim 11, wherein the contact regions have a higher doping concentration than the second doped region, and wherein the contact regions respectively border opposite sidewalls of the gate electrode.

13. The IC of claim 12, further comprising:
an interconnect structure overlying the gate structure and the contact regions, wherein the interconnect structure comprises a plurality of wires and a plurality of vias, and wherein the wires and the vias define a conductive path electrically shorting the contact regions together.

14. The IC of claim 12, wherein the second doped region spaces the first doped region from the contact regions.

15. The IC of claim 12, wherein the first doped region contacts the contact regions respectively at PN junctions.

16. The IC of claim 12, wherein the upward protrusion directly underlies the gate electrode.

17. A varactor comprising:
- a gate structure overlying a substrate, wherein the gate structure comprises a gate dielectric layer overlying the substrate and a gate electrode overlying the gate dielectric layer;
- a well region disposed within the substrate and directly underlying the gate dielectric layer, wherein the well region comprises a first doping type;
- a pair of contact regions disposed within the substrate and disposed on opposing sides of the well region, wherein the pair of contact regions comprise the first doping type, and wherein a doping concentration of the pair of contact regions is greater than a doping concentration of the well region;
- a lower doped region disposed within the substrate and underlying the well region, wherein the lower doped region comprises the first doping type, and wherein a doping concentration of the lower doped region is less than the doping concentration of the well region; and
- a RESURF region disposed within the substrate and disposed between the well region and the lower doped region, wherein the RESURF region comprises a second doping type that is opposite the first doping type.

18. The varactor of claim 17, wherein a doping concentration of the RESURF region is less than the doping concentration of the pair of contact regions.

19. The varactor of claim 17, wherein the RESURF region comprises a protrusion that extends upward towards the gate structure at a location directly under the gate structure, wherein the protrusion is spaced vertically above a bottom surface of the pair of contact regions, and wherein the well region is disposed between the protrusion and the pair of contact regions.

20. The varactor of claim 17, wherein a bottom surface of the well region is aligned with a bottom surface of the pair of contact regions, wherein the RESURF region continuously laterally extends from the bottom surface of the pair of contact regions to the bottom surface of the well region.

\* \* \* \* \*